(12) United States Patent
Bernstein

(10) Patent No.: US 6,222,304 B1
(45) Date of Patent: Apr. 24, 2001

(54) MICRO-SHELL TRANSDUCER

(75) Inventor: Jonathan J. Bernstein, Medfield, MA (US)

(73) Assignee: The Charles Stark Draper Laboratory, Cambridge, MA (US)

( * ) Notice: Subject to any disclaimer, the term of this patent is extended or adjusted under 35 U.S.C. 154(b) by 0 days.

(21) Appl. No.: 09/362,780

(22) Filed: Jul. 28, 1999

(51) Int. Cl.[7] .................................................. H01L 41/08
(52) U.S. Cl. ......................... 310/328; 310/330; 310/339; 310/371
(58) Field of Search ..................................... 310/324, 328, 310/330, 339, 349, 371

(56) References Cited

U.S. PATENT DOCUMENTS

| | | | |
|---|---|---|---|
| 3,940,637 | * | 2/1976 | Ohigashi et al. .................. 310/330 |
| 4,184,094 | * | 1/1980 | Kopel .................................. 310/335 |
| 4,539,575 | * | 9/1985 | Nilsson .......................... 346/140 R |
| 4,642,508 | * | 2/1987 | Suzuki et al. .................... 310/321 |
| 4,888,598 | * | 12/1989 | Heinzl et al. .................. 346/140 R |
| 5,309,519 | * | 5/1994 | Park et al. ....................... 381/190 |
| 5,589,725 | * | 12/1996 | Haertling ......................... 310/358 |
| 5,600,197 | * | 2/1997 | Takeuchi et al. ................ 310/328 |
| 5,736,808 | * | 4/1998 | Szilagyi et al. ................. 310/322 |
| 5,831,371 | * | 11/1998 | Bishop ............................ 310/328 |
| 5,973,441 | * | 10/1999 | Lo et al. ......................... 310/330 |
| 5,997,671 | * | 12/1999 | Takeuchi et al. .............. 156/89.11 |
| 6,017,117 | * | 1/2000 | McClelland et al. ............... 347/84 |
| 6,042,345 | * | 3/2000 | Bishop et al. ................... 417/322 |
| 6,060,811 | * | 5/2000 | Fox et al. ....................... 310/311 |
| 6,091,182 | * | 7/2000 | Takeuchi et al. ................ 310/330 |

FOREIGN PATENT DOCUMENTS 4-187441 * 7/1992 (JP) .................................. 310/324

OTHER PUBLICATIONS

J.G. Smits, "The effectiveness of a piezoelectric bimorph to perform mechanical work against various spring type loads", Ferroelectrics 120 (1991), pp. 241–252, Dec. 1991.

R.E. Newnham et al., "Flextensional Moonie Actuators", Proceedings of the 1993 IEEE Ultrasonics Symposiium vol. 1, (Baltimore, MD, Oct. 31, 1993–Nov. 3, 1993), pp. 509–513.

A. Dogan, K. Uchino, and R.E. Newnham, Composite Piezoelectric Transducer with Truncated Conical Endcaps, "Cymbal", IEEE Trans. on Ultrasonics, Ferroelectrics and Frequency Control v 44 #3, May 1997, pp. 597–605.

R.A. Nelson, Jr. and L.J. Royster, "Development of a Mathematical Model for the Class V Flextensional Underwater Acoutstic Transducer", Journal of the Acooustical Society of America, vol. 49 #5 (Part 2), pp. 1609–1620 (1971), Dec. 1971.

J. Bernstein et al., "Micromachined High Frequency Ferroelectric Sonar Transducers", IEEE Transactions on Ultrasonics, Ferroelectrics and Frequency Control, vol. 44, No. 5, Sep. 1997, pp. 960–969.

Cheol–Hyun Han and Eun Sok Kim, Fabrication of Dome––Shaped Diaphragm with Circular Clamped Boundaary on Silicon Substrate, Dept. of Electrical Engineering, University of Hawaii, IEEE, 0–7803–5194–0/99 (1999), Dec. 1999.

* cited by examiner

*Primary Examiner*—Thomas M. Dougherty
(74) *Attorney, Agent, or Firm*—Iandiorio & Teska

(57) ABSTRACT

A micro-shell transducer includes a substrate; an electroactive medium mounted on the substrate and including an arched section spaced from the substrate defining a chamber between the substrate and arched section; and a pair of electrodes mounted on the medium for either applying an electric field across the medium for flexing the arched section or sensing the electric field generated by a flexure of the medium.

32 Claims, 3 Drawing Sheets

MICRO-SHELL TRANSDUCER

FIELD OF INVENTION

This invention relates to an improved transducer for inducing and/or sensing motion in an electro-active medium.

BACKGROUND OF INVENTION

Transducers using piezoelectric and ferroic electric materials are used to make accelerometers, displacement sensors and actuators and acoustic transducers including high frequency ultrasound transducers, microphones, hydrophones, loudspeakers and ultrasonic range finders. Ferroic electric herein and throughout this application includes ferroelectric, pyroelectric and electrostrictive. Former methods of performing these functions are electrostatic condenser microphones, dice and fill PZT transducers, bimorph and monomorph ferroelectric and piezoelectric transducers, flextensional transducers, cymbals and moonies. The monomorph and bimorph transducers are good sensors, but are very inefficient as speakers (projectors). This is because the two layers of the bimorph "fight" each other. When electrical energy is put in, 99.5% of the energy goes into internal strain and electric field energy, while only 0.5% is available to do external work. The typical energy efficiency of a bimorph or monomorph is therefore less than 0.5% (off resonance). Hence as an actuator these transducers are not very satisfactory.

BRIEF SUMMARY OF THE INVENTION

It is therefore an object of this invention to provide an improved transducer for inducing and/or sensing motion in a fluid or solid medium.

It is a further object of this invention to provide such an improved transducer for inducing and/or sensing motion in a fluid or solid medium which is more efficient.

It is a further object of this invention to provide such an improved transducer for inducing and/or sensing motion in a fluid or solid medium which has greater bandwidth.

It is a further object of this invention to provide such an improved transducer for inducing and/or sensing motion in a fluid or solid medium which reduces the strain energy stored internally and allows more of the mechanical work to be done against an external load.

The invention results from the realization that a truly effective transducer with higher efficiency and broader bandwidth can be achieved using a micro-shell construction in which an electro-active medium is formed with an arch section which more efficiently responds to electrical and mechanical forces and electrodes are used to either apply an electric field and induce a strain to flex the arch section or sense an electric field induced by the strain in the arch section in response to application of an external force.

This invention features a micro-shell transducer including a substrate and an electron-active medium mounted on the substrate and including an arched section spaced from the substrate defining a chamber between the substrate and arched section. A pair of electrodes is mounted on the medium for applying an electric field across the medium for flexing the arched section.

The invention also features a micro-shell transducer including a substrate and an electro-active medium mounted on the substrate and including an arched section spaced from the substrate defining a chamber between the substrate and arched section. A pair of electrodes is mounted on the medium for sensing the electric field generated by a flexure of the medium.

In preferred embodiments the electro-active medium may include a piezoelectric material or a ferroic material. The ferroic material may include a ferroelectric material, a pyroelectric material or an electrostrictive material. The arched section may be a cylindrical section and the medium may further include a shoulder section on each side of the cylindrical section. The electrodes may be mounted one near each shoulder section. The electric field may extend across the arched section and induce strain in the arched section in the same direction to flex the arched section. The electrodes may be mounted on the top and bottom surfaces of the medium. The electric field may extend between the surface and induce strain across the arched section to flex the arched section. The medium may include a peripheral shoulder surrounding the arched section. The arched section may be generally spherical. The electrodes may be mounted one at generally the center of the arched section and one generally at its edge when the arched section is generally spherical. The electrical field may extend generally radially in the arched section and induce strain in the same direction to flex the arched section. The arched section may be convex upwardly or it may be concave downwardly and the substrate may include a recess for accommodating the arched section and chamber. The chamber may be sealed. There may be a plurality of arched sections.

BRIEF DESCRIPTION OF THE DRAWINGS

Other objects, features and advantages will occur to those skilled in the art from the following description of a preferred embodiment and the accompanying drawings, in which.

Figure 1:
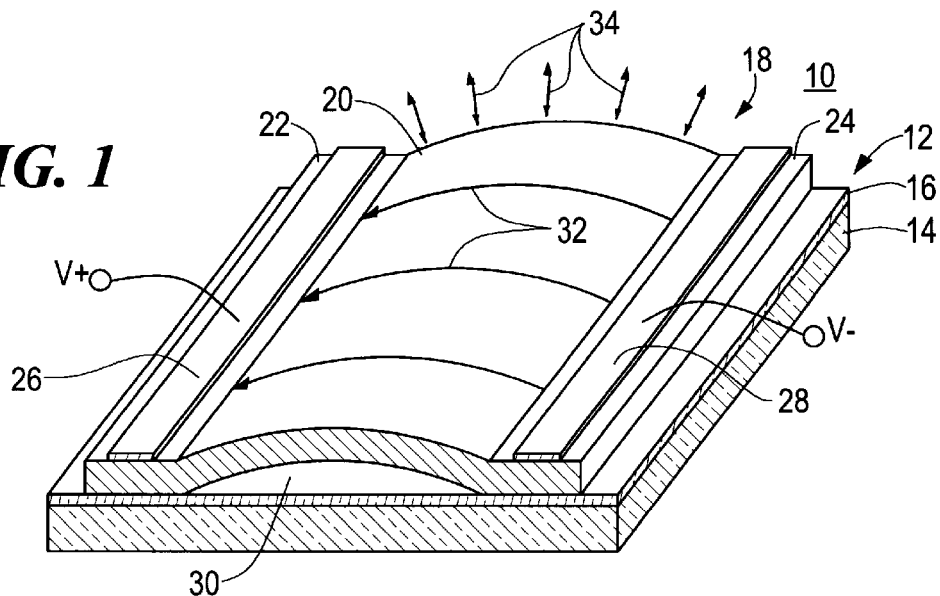
FIG. 1 is a three-dimensional diagrammatic view of a section of a micro-shell transducer according to this invention.

There is shown in FIG. 1 a micro-shell transducer 10 according to this invention including a support substrate 12 including a support layer 14 such as glass or silicon and an insulating layer 16 such as silicon dioxide. Mounted on substrate 12 is a solid electro-active medium 18 which includes an arched section 20 and two shoulder sections 22 and 24. A pair of electrodes 26 and 28 are mounted on each shoulder 22 and 24 near the edge of arched section 20 and create a chamber 30 between the arched section 20 and substrate 12. Arched section 20 is depicted as a section of a cylinder and may extend along its longitudinal axis in either direction. At the ends typically the arched section is turned down to join the substrate and therefore make chamber 30 a sealed chamber which can be filled with, for example, air or it may be a vacuum. As an actuator the device may be employed as an acoustic actuator or sensor, a displacement actuator or sensor, an accelerometer, or may be used in any of a variety of other applications. In the actuator mode a voltage is applied across electrodes 24 and 26 which applies a field between them as shown by lines 32. A strain is induced in the same direction as lines 32 and this causes a movement or flexing of the arched section 20 either up or down in the direction as shown by arrows 34. The electro-active medium 18 may be any type of ferroic material such as ferroelectric, electrostrictive or pyroelectric. Examples of ferroelectric materials are PZT, lead titanate and strontium titanate, an example of an electrostrictive material is lead magnesium niobate (PMN) and examples of pyroelectric materials are lead titanate (PT) and lead zirconate titanate (PZT). As a sensor, electrodes 24 and 26 would be connected to a sensing circuit whereby a force applied in the direction of arrows 34 would induce a strain in the direction of lines 32 which would create an electric field in the direction of lines 32 that would generate a voltage across electrodes 24 and 26 that can be sensed.

Figure 2:
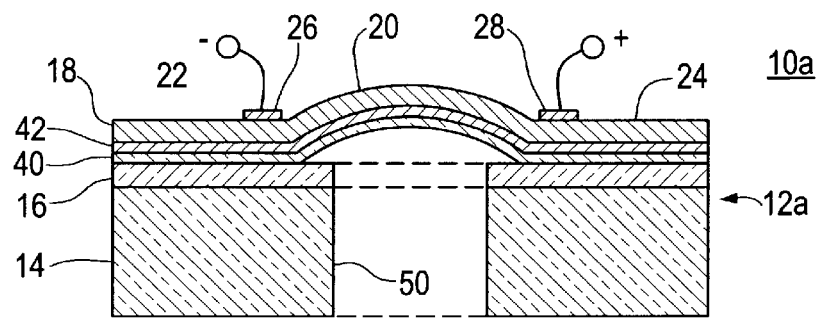
FIG. 2 is a cross-sectional view of the transducer of FIG. 1 showing the transducer construction in more detail.

Micro-shell transducer 10 in FIG. 1 is somewhat simplified for ease of understanding. A more detailed depiction of its construction is shown in FIG. 2. An additional structural layer 40 may be formed of polysilicon or silicon nitride $Si_3N_4$, or silicon carbide SiC, and a buffer layer 42 conducive to growing PZT, such as $ZrO_2$, may be used. Electro-active medium 18 would then be PZT, that is, lead zirconate titanate. The electrodes may be titanium and platinum. If desired, chamber 30 need not be sealed. For example, as shown in FIG. 2 in the phantom lines, when it is desirable to sense acoustic waves from the substrate side rather than the electro-active medium side of transducer 10a, a hole 50 may be provided through the silicon layer 14 and silicon dioxide layer 16 for allowing access to the underside of arched section 20 through substrate 12a.

Figure 3:
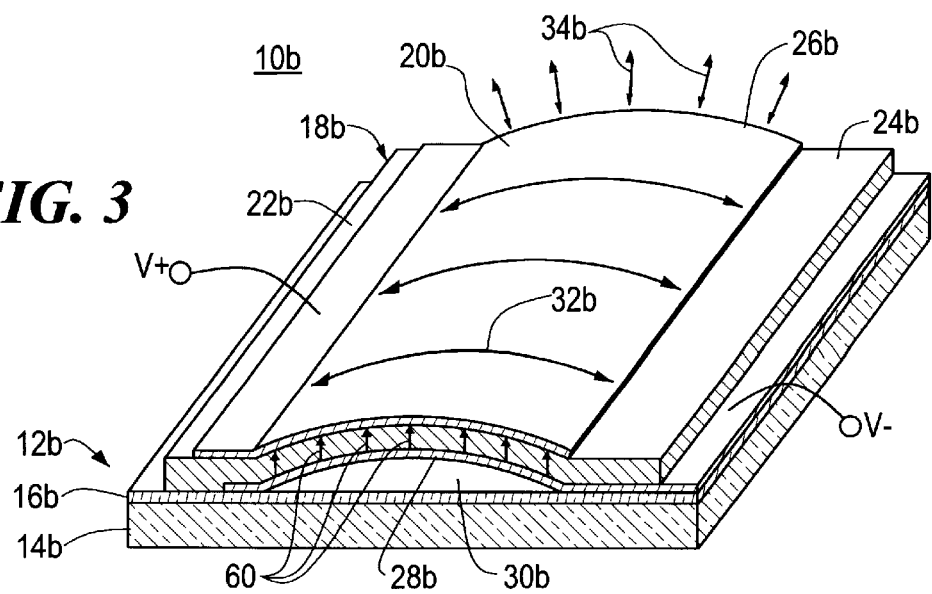
FIG. 3 is a view similar to FIG. 1 of an alternative embodiment of the transducer of this invention.

In another embodiment where the electro-active material may be made of a piezoelectric material such as zinc oxide, quartz, tourmaline, or aluminum nitride (AlN), as well as a ferroic material, is shown in FIG. 3, where the electro-active material 18b is formed in the same way with an arched section 20b having shoulders 22b and 24b. However, the electrodes 26b and 28b are applied on the upper and lower surfaces of electro-active medium 18b. Thus the electric field occurs through the arched section 18b in the direction as indicated by arrows 60. This permits the medium 18b to be a piezoelectric material as well as a ferroic material. The strain is nevertheless induced in the direction of arrow 32b and the flexure or mechanical motion occurs in the direction of arrows 34b. Whether transducer 10b is used as an actuator or a sensor type of device simply depends on whether the electrodes are used to sense or to apply an electric field.

Figure 4:
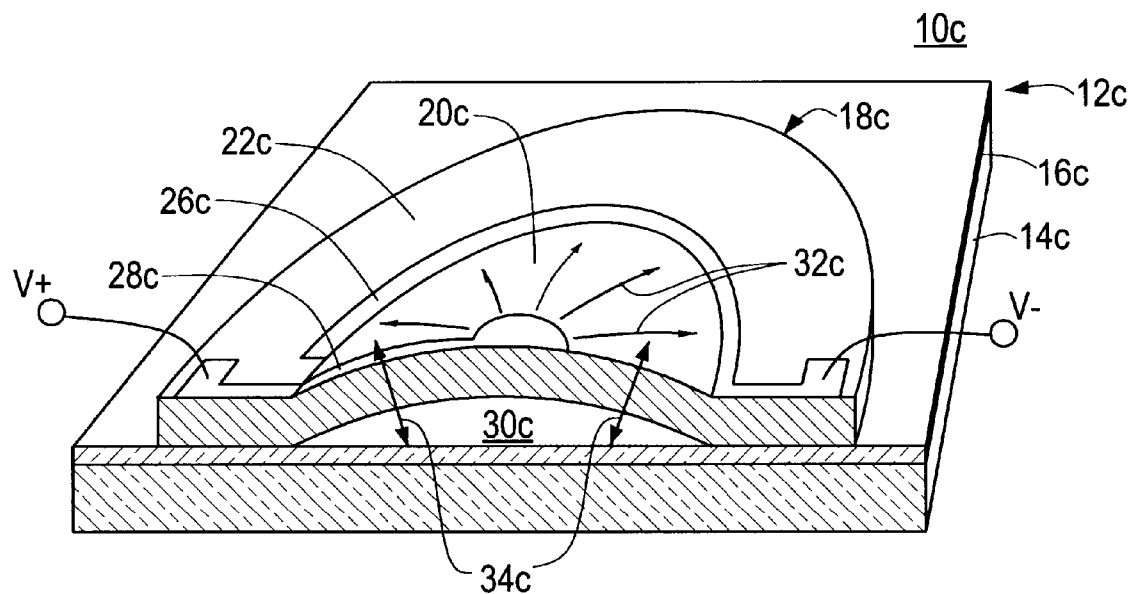
FIG. 4 is a view similar to FIGS. 1 and 3 of another embodiment of the transducer of this invention.

Although thus far the embodiments are shown as having arched sections which are generally cylindrical in shape, this is not a necessary limitation of the invention. For example, as show in FIG. 4, the electro-active medium can be in an elliptical or circular or polygonal shape. In FIG. 4, which is a sectional drawing, only one half of the transducer 10c is shown. Here the electrodes are placed so that one 28c is near the center of arched section 20c and the other 26c is near its edge. The electric field extends generally radially as shown by arrows 32c as does the strain, whereas the flexure occurs in the direction as shown by arrows 34c.

Figure 5:
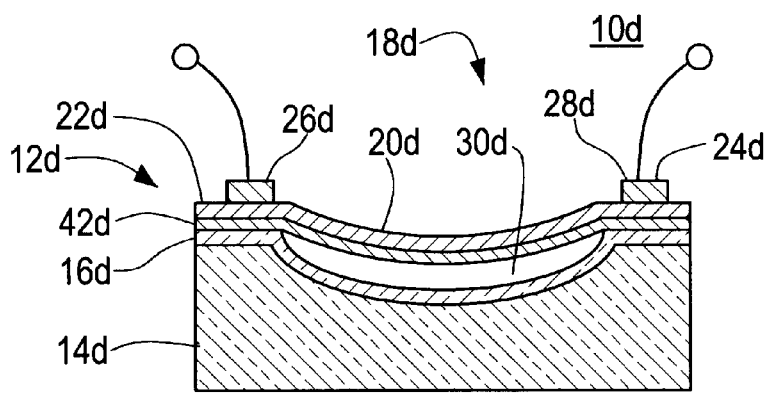
FIG. 5 is a diagrammatic cross-sectional view of another embodiment of the transducer of this invention.

Although thus far the micro-shell transducer according to this invention has been shown with the arched section convex upwardly, this is not a necessary limitation of the invention. For example, as shown in FIG. 5, the electro-active medium 20d may be formed concavely downwardly creating chamber 30d in the recess formed in substrate 12d by the concavity in the silicon layer 14d and silicon dioxide layer 16d.

Figure 6:
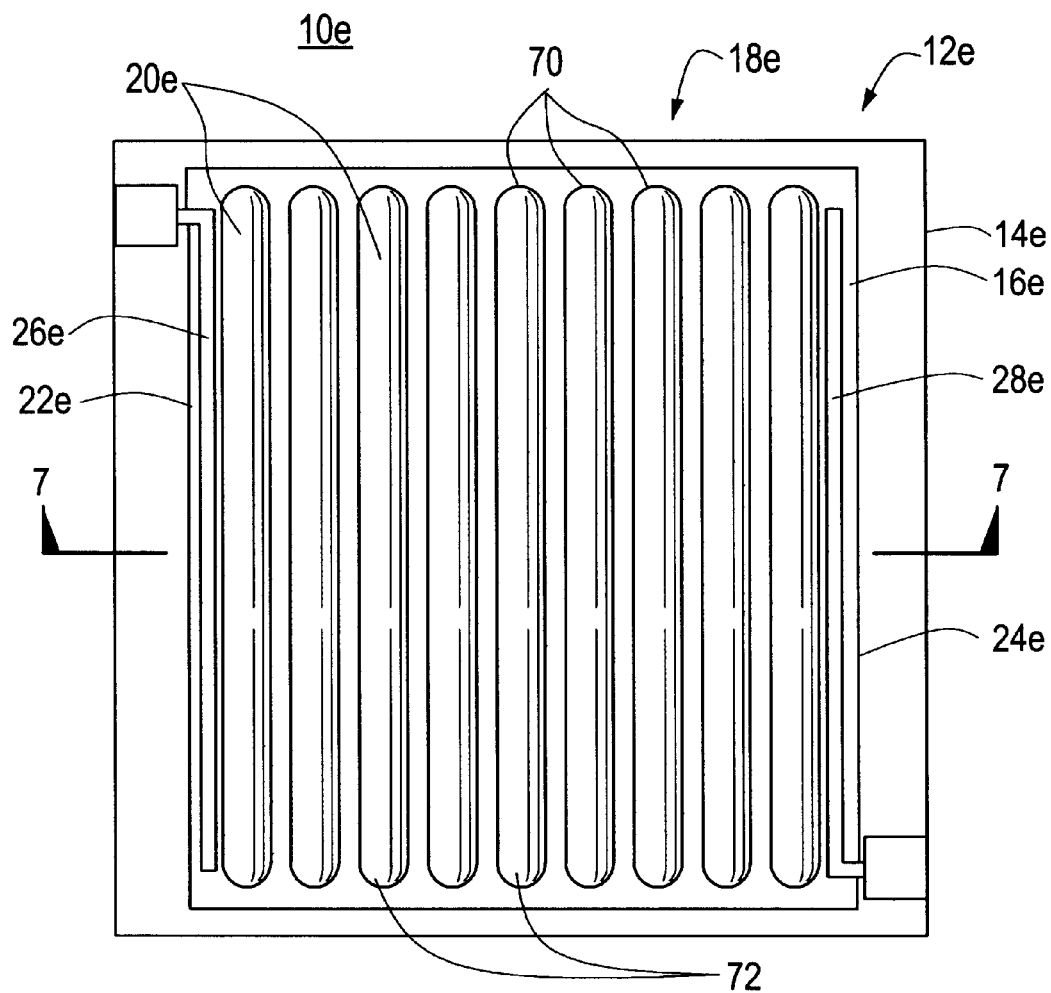
FIG. 6 is a diagrammatic top plan view of a multi-shell transducer according to this invention.
Figure 7:
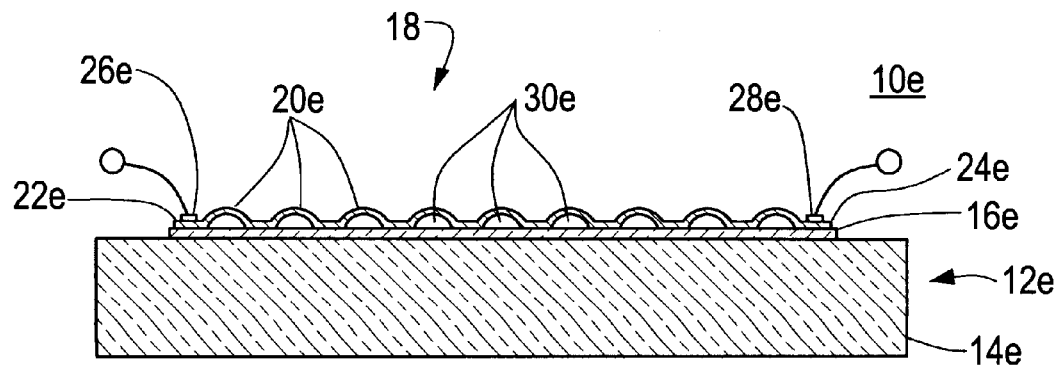
FIG. 7 is a sectional view along line 7—7 of FIG. 6.

Although thus far the embodiments are shown as a single cell device this is not a necessary limitation of the invention either, for as shown in FIG. 6 there may be a plurality of sections of electro-active material such as cylindrical sections 20e serviced by electrodes 26e and 28e to form an array which may be used as a sensor or an actuator. By constructing several unit cells in an array on a common substrate, phased array operation is possible. Also shown in FIGS. 6 and 7 is the fact that the ends 70, 72 of each of the cylindrical arched sections 20e are formed down against the silicon dioxide layer 16e to close and seal the chambers within each arched section.

Although specific features of the invention are shown in some drawings and not in others, this is for convenience only as each feature may be combined with any or all of the other features in accordance with the invention.

Other embodiments will occur to those skilled in the art and are within the following claims:

What is claimed is:

1. A micro-shell transducer comprising:
   a substrate;
   an electro-active medium mounted on said substrate and including an arched section spaced from said substrate defining a chamber between said substrate and arched section; and
   a pair of electrodes mounted on the same surface of said medium for applying an electric field across said medium for flexing said arched section.

2. The micro-shell transducer of claim 1 in which said electro-active medium includes a piezoelectric material.

3. The micro-shell transducer of claim 1 in which said electro-active medium includes a ferroic material.

4. The micro-shell transducer of claim 3 in which said ferroic material includes a ferroelectric material.

5. The micro-shell transducer of claim 3 in which said ferroic material includes a pyroelectric material.

6. The micro-shell transducer of claim 3 in which said ferroic material includes an electrostrictive material.

7. The micro-shell transducer of claim 1 in which said arched section is a cylindrical section and said medium further includes a shoulder section on each side of said cylindrical section.

8. The micro-shell transducer of claim 7 in which said electrodes are mounted one near each shoulder section.

9. The micro-shell transducer of claim 8 in which said electric field extends across said arched section and induces strain in the same direction to flex said arched section.

10. The micro-shell transducer of claim 1 in which said chamber is sealed.

11. The micro-shell transducer of claim 1 in which there are a plurality of arched sections.

12. The micro-shell transducer of claim 1 in which said medium includes a peripheral shoulder surrounding said arched section.

13. The micro-shell transducer of claim 12 in which said arched section is generally spherical.

14. The micro-shell transducer of claim 12 in which said electrodes are mounted one at generally the center of said arched section and one generally at its edge.

15. The micro-shell transducer of claim 14 in which said electric field extends generally radially in said arched section and induces strain in the same direction to flex said arched section.

16. The micro-shell transducer of claim 1 in which said arched section is convex upwardly.

17. The micro-shell transducer of claim 1 in which said electro-active medium extends concave downwardly and said substrate includes a recess for accommodating said arched section and chamber.

18. A micro-shell transducer comprising:

a substrate;

an electro-active medium mounted on said substrate and including an arched section spaced from said substrate defining a chamber between said substrate and arched section; and a pair of electrodes mounted on the same surface of said medium for sensing the electric field generated by a flexure of said medium.

19. The micro-shell transducer of claim 18 in which said electro-active medium extends concave downwardly and said substrate includes a recess for accommodating said arched section and chamber.

20. The micro-shell transducer of claim 18 in which said chamber is sealed.

21. The micro-shell transducer of claim 18 in which said electro-active medium includes a piezoelectric material.

22. The micro-shell transducer of claim 18 in which said electro-active medium includes a ferroic material.

23. The micro-shell transducer of claim 22 in which said ferroic material includes a ferroelectric material.

24. The micro-shell transducer of claim 22 in which said ferroic material includes a pyroelectric material.

25. The micro-shell transducer of claim 22 in which said ferroic material includes a electrostrictive material.

26. The micro-shell transducer of claim 18 in which said arched section is a cylindrical section and said medium further includes a shoulder section on each side of said cylindrical section.

27. The micro-shell transducer of claim 26 in which said electrodes are mounted one near each shoulder section.

28. The micro-shell transducer of claim 18 in which there are a plurality of arched sections.

29. The micro-shell transducer of claim 18 in which said medium includes a peripheral shoulder surrounding said arched section.

30. The micro-shell transducer of claim 29 in which said arched section is generally spherical.

31. The micro-shell transducer of claim 29 in which said electrodes are mounted one at generally the center of said arched section and one generally at its edge.

32. The micro-shell transducer of claim 18 in which said arched section is convex upwardly.

* * * * *

UNITED STATES PATENT AND TRADEMARK OFFICE
CERTIFICATE OF CORRECTION

PATENT NO.    : 6,222,304 B1                                              Page 1 of 1
DATED         : April 24, 2001
INVENTOR(S)   : Bernstien It is certified that error appears in the above-identified patent and that said Letters Patent is hereby corrected as shown below:

<u>Column 1,</u>
Line 2, insert the following:
--                           GOVERNMENT INTEREST
This invention was made with Government support under Contract/Grant N00014-98-C-0259 awarded by The Department of the Navy. The Government has certain rights in the invention. --

Signed and Sealed this

Second Day of September, 2003

JAMES E. ROGAN
*Director of the United States Patent and Trademark Office*